(12) United States Patent
Frederick, Jr. et al.

(10) Patent No.: US 8,803,290 B2
(45) Date of Patent: Aug. 12, 2014

(54) DOUBLE BROKEN SEAL RING

(75) Inventors: Norman Frederick, Jr., Vista, CA (US); Tom Myers, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 956 days.

(21) Appl. No.: 12/245,048

(22) Filed: Oct. 3, 2008

(65) Prior Publication Data

US 2010/0084751 A1 Apr. 8, 2010

(51) Int. Cl.
*H01L 23/544* (2006.01)

(52) U.S. Cl.
USPC ...... 257/620; 257/E23.18; 257/619; 257/776; 438/113; 438/458; 438/462

(58) Field of Classification Search
CPC .................................................. H01L 23/585
USPC ............ 257/E23.18, 619, 620, 678, E23.142, 257/E21.642, 508, 660, 662, 688, 659, 758, 257/774; 427/96.2; 438/113, 458, 459, 462, 438/977, 106, 118
See application file for complete search history.

(56) References Cited

U.S. PATENT DOCUMENTS

| | | | |
|---|---|---|---|
| 5,739,546 A * | 4/1998 | Saitou et al. | 257/48 |
| 5,834,829 A * | 11/1998 | Dinkel et al. | 257/620 |
| 6,365,958 B1 | 4/2002 | Ibnabdeljalil et al. | |
| 6,399,897 B1 * | 6/2002 | Umematsu et al. | 174/261 |
| 6,455,910 B1 * | 9/2002 | Wang | 257/484 |
| 6,479,869 B1 | 11/2002 | Hiraga | |
| 6,509,617 B2 * | 1/2003 | Hiraga | 257/409 |
| 6,537,849 B1 | 3/2003 | Tsai et al. | |
| 6,943,063 B2 | 9/2005 | Tsai et al. | |
| 6,998,712 B2 * | 2/2006 | Okada et al. | 257/758 |
| 7,087,496 B2 | 8/2006 | Gutierrez | |
| 7,235,864 B2 * | 6/2007 | Lee | 257/620 |
| 7,253,487 B2 | 8/2007 | Chen | |
| 7,550,850 B2 | 6/2009 | Nakashiba | |
| 7,602,065 B2 * | 10/2009 | Hou et al. | 257/758 |
| 7,692,265 B2 | 4/2010 | Takewaki et al. | |
| 7,741,715 B2 * | 6/2010 | Kim et al. | 257/758 |
| 7,772,682 B1 * | 8/2010 | Zhang et al. | 257/684 |

(Continued)

FOREIGN PATENT DOCUMENTS

| | | |
|---|---|---|
| JP | 2000150802 A | 5/2000 |
| JP | 2001110991 A | 4/2001 |

(Continued)

OTHER PUBLICATIONS

International Search Report and Written Opinion—PCT/US2009/059264, International Search Authority—European Patent Office—Apr. 8, 2010.

(Continued)

*Primary Examiner* — Chris Chu

(74) *Attorney, Agent, or Firm* — Sam Talpalatsky; Nicholas J. Pauley; Joseph Agusta

(57) ABSTRACT

The amount of signal propagation and moisture penetration and corresponding reliability problems due to moisture penetration degradation in an IC can be reduced by fabricating two seal rings with non-adjacent gaps. In one embodiment, the same effect can be achieved by fabricating a wide seal ring with a channel having offset ingress and egress portions. Either of these embodiments can also have grounded seal ring segments which further reduce signal propagation.

20 Claims, 5 Drawing Sheets

(56) References Cited

U.S. PATENT DOCUMENTS

| | | |
|---|---|---|
| 7,786,546 B2 * | 8/2010 | Hsu ............................... 257/508 |
| 7,843,019 B2 * | 11/2010 | Mallikarjunaswamy et al. ............................ 257/409 |
| 7,888,776 B2 * | 2/2011 | Ogawa et al. ................. 257/620 |
| 7,898,007 B2 * | 3/2011 | Lee et al. ...................... 257/211 |
| 7,898,056 B1 * | 3/2011 | Keramat et al. ............... 257/503 |
| 2002/0000642 A1 * | 1/2002 | Lin et al. ....................... 257/620 |
| 2002/0167071 A1 * | 11/2002 | Wang ............................. 257/620 |
| 2005/0218477 A1 * | 10/2005 | Takewaki et al. ............. 257/531 |
| 2006/0102980 A1 * | 5/2006 | Nakashiba .................... 257/508 |
| 2008/0150144 A1 | 6/2008 | Park |
| 2008/0179710 A1 * | 7/2008 | Yip et al. ...................... 257/620 |
| 2008/0230873 A1 * | 9/2008 | Demircan et al. ............ 257/620 |
| 2008/0251923 A1 | 10/2008 | Wang et al. |
| 2008/0273286 A1 * | 11/2008 | Kang .......................... 361/301.4 |
| 2009/0294929 A1 * | 12/2009 | Lee et al. ...................... 257/659 |
| 2010/0102421 A1 * | 4/2010 | Chang et al. .................. 257/659 |

FOREIGN PATENT DOCUMENTS

| | | |
|---|---|---|
| JP | 2002141415 A | 5/2002 |
| JP | 2004297022 A | 10/2004 |
| JP | 2005286264 A | 10/2005 |
| JP | 2006147668 A | 6/2006 |
| JP | 2007059676 A | 3/2007 |
| JP | 2008071818 A | 3/2008 |
| TW | I286783 B | 9/2007 |

OTHER PUBLICATIONS

Taiwan Search Report—TW098133648—TIPO—Nov. 22, 2012.

* cited by examiner

FIG. 3A
FIG. 3B
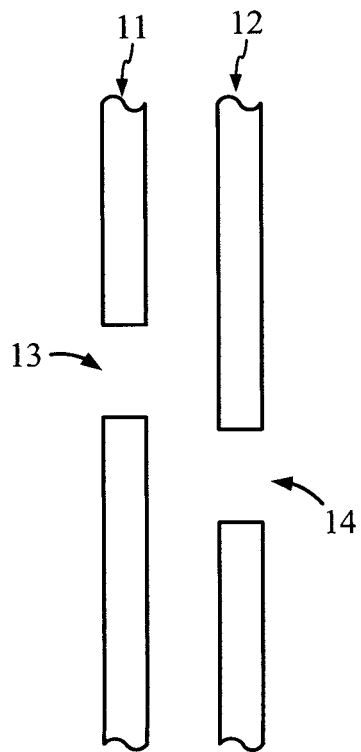
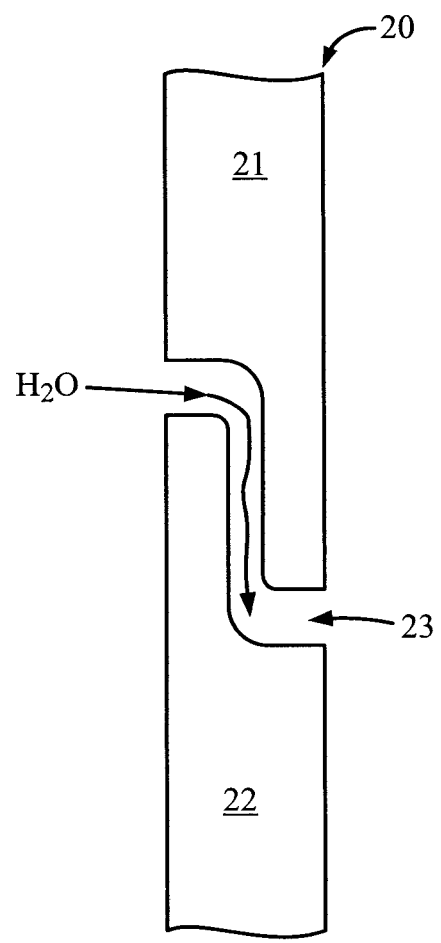

DOUBLE BROKEN SEAL RING

TECHNICAL FIELD

The present disclosure generally relates to integrated circuits (ICs). More specifically, this disclosure relates to seal rings configurations to reduce signal propagation and to reduce moisture penetration.

BACKGROUND

Seal rings, which are rings composed of metals such as copper, aluminum, or gold, are fabricated around the perimeter of ICs to prevent IC cracking during the dicing process. An additional benefit in using a seal ring is that it serves as a barrier to moisture. That is, over time, as the IC is exposed to moisture, the IC performance may degrade without the use of a seal ring.

However, use of these seal rings also has disadvantages, including unwanted noise/signal propagation. Many times, a noise source, such as a digital signal input/output pad, clock input pad, power amplifier, etc., located on the IC causes noise to propagate along the seal ring, which subsequently can interfere with the operation of other devices on the IC. This is problematic because the devices on the IC are not then isolated from each other as may otherwise be intended and designed.

Conventionally, seal rings have taken two forms. First, single seal rings have been used that are composed of one solid piece of metal. The substrate below the seal ring is usually doped and then connected with vias to the bottom of the metal to make the best substrate connection to the metal seal ring. This helps reduce moisture contamination of the IC; however, this type of ring allows for noise signals to propagate from a noise source along the seal ring to other devices on the IC.

To alleviate this noise propagation issue, a single seal ring has been used which incorporates several "breaks," or intermittent interruptions. This helps to reduce the noise propagation problem, but poses a risk to reliability because moisture can enter the IC through these breaks in the seal ring and degrade the device performance over time.

BRIEF SUMMARY

The present disclosure is directed to a method of fabricating a broken seal ring that will reduce noise propagation by breaking the seal ring conduction path while also minimizing the amount of moisture penetrating the IC.

Specifically, the present disclosure is directed to a sealing system for an integrated circuit, where a first seal ring circumscribes the integrated circuit, and has at least one gap. A second seal ring circumscribes the first seal ring and has at least one gap offset from the gap of the first seal ring.

The present disclosure is further directed to a sealing system for an integrated circuit that contains a seal ring circumscribing the integrated circuit with at least one channel. The channel includes an ingress portion and an egress portion. The ingress portion is offset from the egress portion.

The present disclosure is further directed to an integrated circuit with a sealing system, where a first seal ring circumscribes the integrated circuit, and has at least one gap. A second seal ring circumscribes the first seal ring.

The present disclosure is further directed to a method for forming a sealing system for an integrated circuit by forming a first seal ring circumscribing the integrated circuit. The first seal ring includes at least one gap. The method also includes forming a second seal ring circumscribing the first seal ring, where the second seal ring includes at least one gap offset from the gap of the first seal ring.

The foregoing has outlined rather broadly the features and technical advantages of the present disclosure in order that the detailed description of the disclosure that follows may be better understood. Additional features and advantages of the disclosure will be described hereinafter which form the subject of the claims of the disclosure. It should be appreciated by those skilled in the art that the conception and specific embodiments disclosed may be readily utilized as a basis for modifying or designing other structures for carrying out the same purposes of the present disclosure. It should also be realized by those skilled in the art that such equivalent constructions do not depart from the spirit and scope of the disclosure as set forth in the appended claims. The novel features which are believed to be characteristic of the disclosure, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

FIGS. 3A and 3B are schematic diagrams of alternate configurations of a dual broken seal ring.

DETAILED DESCRIPTION

Figure 1A:
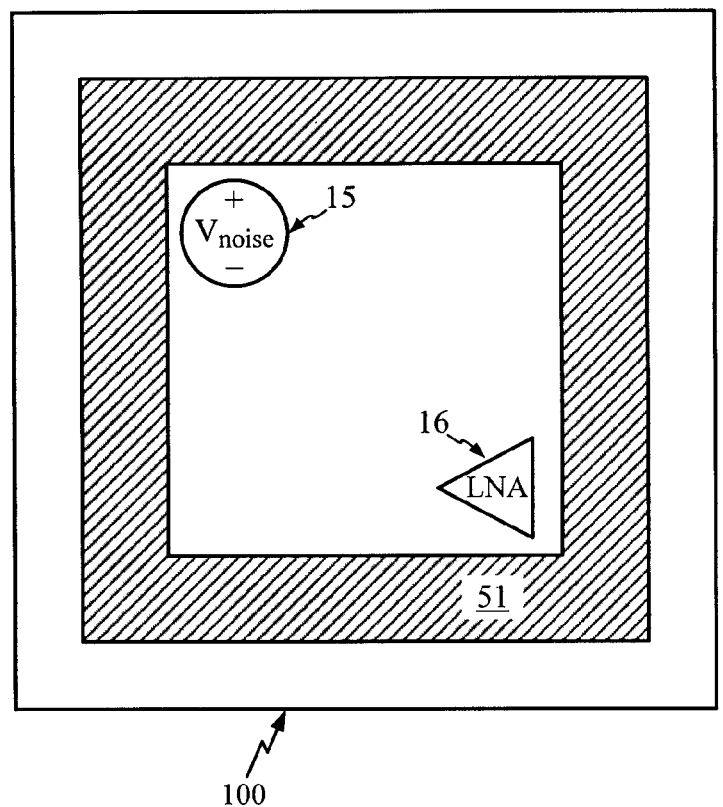
FIGS. 1A and 1B are schematic drawings of an IC device with conventional seal rings.

FIG. 1A is a schematic drawing of an IC 100, such as a radio frequency (RF) IC, with a conventional seal ring 51. The seal ring 51 has no breaks or interruptions. As discussed above, a signal produced by a noise source 15 may propagate along the seal ring 51 and interfere with the performance of other devices on the IC. For example, the IC 100 includes a low noise amplifier (LNA) 16, which is a device that is susceptible to the effects of noise. Because the LNA 16 is susceptible to noise, it has been located as far away on the IC 100 from the noise source 15 as possible. However, those having skill in the art would understand the LNA 16 will nevertheless be subject to the adverse effects of noise created by the noise source 15 due to propagation of noise through the seal ring 51.

Figure 1B:
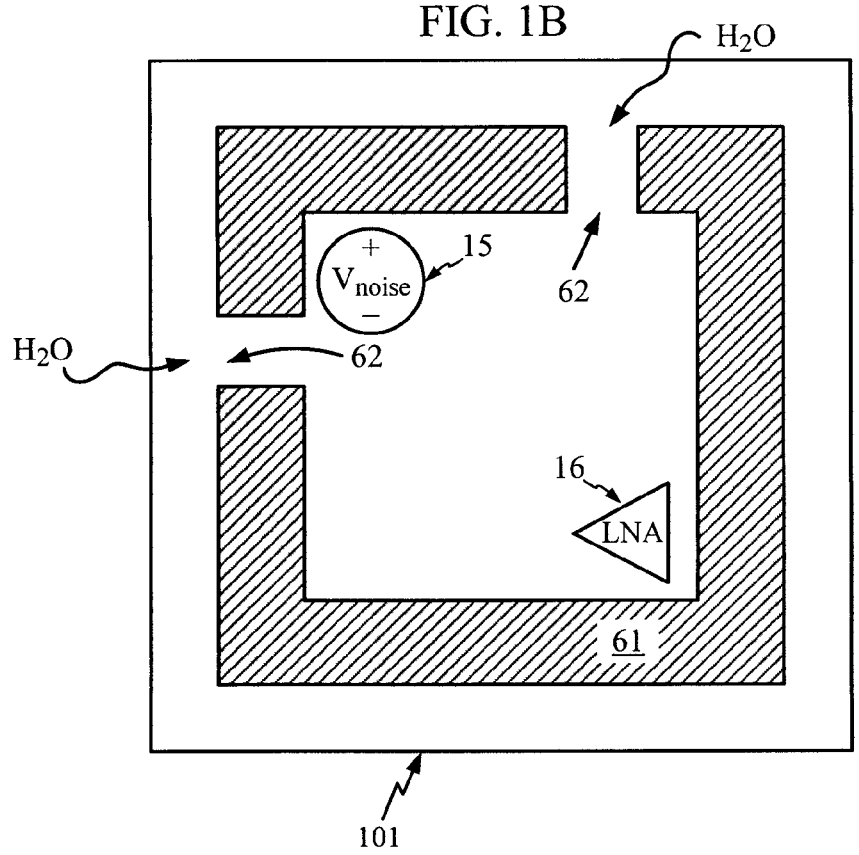

FIG. 1B is a schematic drawing of an IC 101 with a different conventional seal ring 61. As discussed above, the seal ring 61 incorporates breaks, or openings, 62 in the seal ring 61. Such openings 62 may be created during the fabrication process to reduce noise created by the noise source 15 from propagating through the seal ring 61 to the LNA 16. However, while the seal ring 61 has improved noise propagation characteristics as compared with the seal ring 51, the IC 101 is more susceptible to moisture (as illustrated by $H_2O$ in FIG. 1B) penetration through the openings 62.

Figure 2:
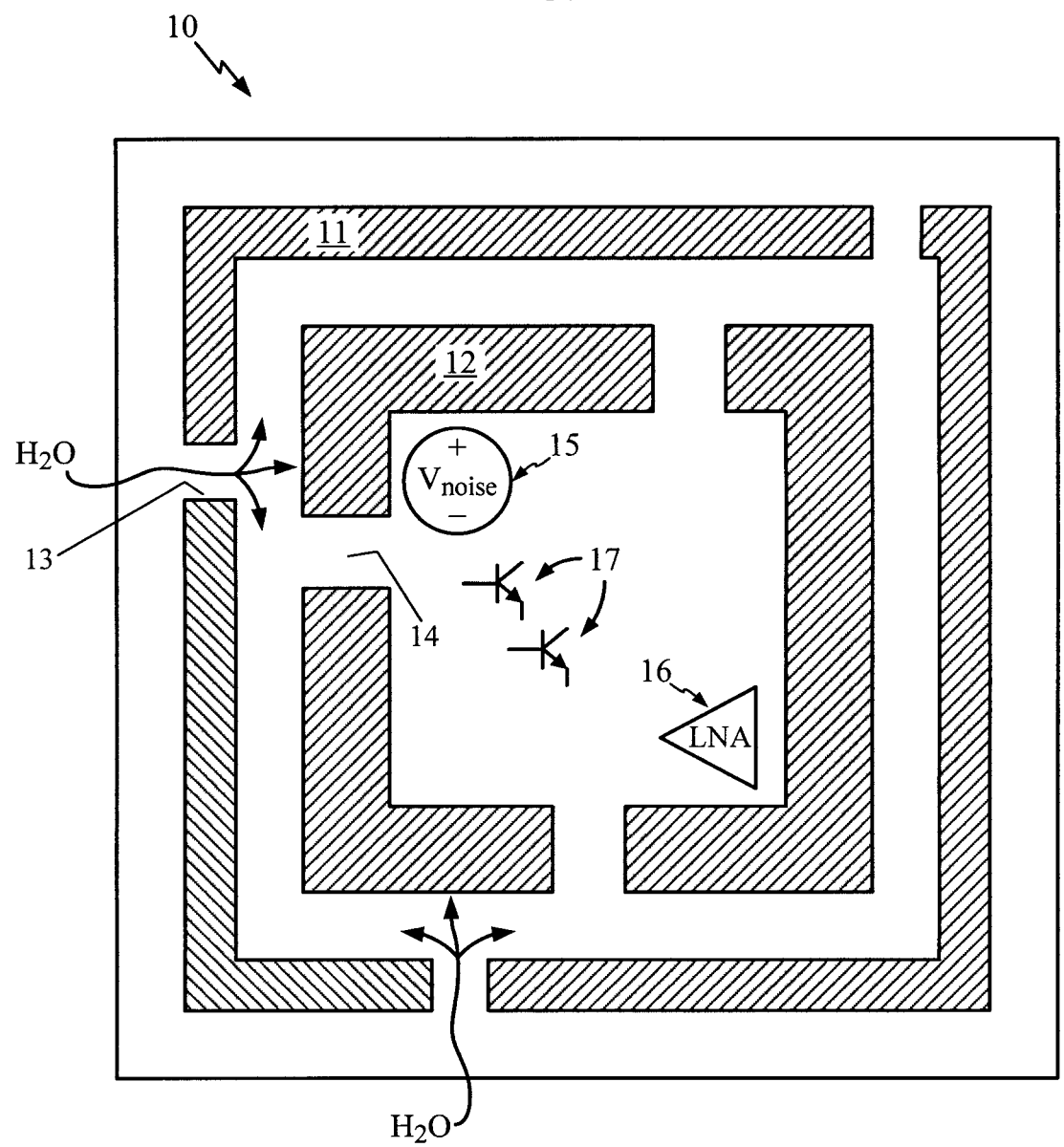
FIG. 2 is a schematic diagram of an exemplary dual broken seal ring.

FIG. 2 is a schematic drawing of an IC 10 that includes a dual broken seal ring. The IC 10 includes two seal rings: an outer ring 11 circumscribing an inner ring 12. Noise coupling between inner and outer seal rings 11, 12 can be reduced in several ways. For example, it is possible to block doping of the substrate between these two seal rings 11, 12, creating a highly resistive path through the substrate. Another option is to block doping of the substrate within each seal break, creating a highly resistive path through the substrate. Alternatively or in addition, it is possible to place ground connections on segments of each seal ring to reduce noisy currents or signals. If the number of ground connects are limited, one embodiment connects grounds to all segments of the inner seal ring 12.

In one embodiment, the substrate is a semiconductor, such as silicon. In another embodiment, the substrate is a ceramic. For convenience, the substrate will be referred to as silicon, although other substrates (such as Galium-Arsinide) are contemplated.

It is noted that the outer seal ring 11 circumscribes the inner seal ring 12 by overlapping with portions of the inner seal ring 12 to reduce moisture penetration. As can be seen in FIG. 2, the outer ring 11 has an opening 13 and the inner ring 12 has an opening 14. The openings 13 and 14 are not aligned with one another and are, in fact, offset from each other. This offset is better illustrated by FIG. 3A. The offset between the openings 13 and 14 reduces the possibility of moisture from the atmosphere penetrating into the IC 10. As shown in FIG. 2, while moisture (illustrated by H₂O) may be able to penetrate through the opening 13 the moisture does not immediately penetrate into the IC 10 which could damage components, such as the transistors 17, in the IC 10. The moisture is blocked by the inner seal ring 12.

The openings 13 and 14 may be fabricated anywhere along the perimeter of the outer ring 11 and the inner ring 12. In one embodiment, the openings 13 and 14 include a separation staggered about 100 um (or more), to reduce the likelihood of moisture penetration into the IC 10. One purpose of the openings 13 and 14 is to stop noise conduction along the perimeter. In one embodiment, the openings are cut through the metal layers as well as the substrate layers of each seal ring 11 and 12. An exemplary width for the openings 13, 14 is 20 um to 50 um.

Although FIG. 2 illustrates three openings on the outer seal ring 11 and three openings on the inner seal ring 12, additional openings may be added to each ring. Moreover, each seal ring 11 and 12 may only have a single opening. In one embodiment, the outer seal ring 11 has no openings, while the inner seal ring 12 has openings. Additionally, the inner ring 12 may include more openings than the outer ring 11 to reduce noise propagation in the IC 10 while still increasing moisture resistance. Furthermore, multiple openings may be added to the inner ring 12 in the general vicinity of devices on the IC 10 that are particularly susceptible to noise (e.g., the LNA 16). When the inner ring 12 includes multiple openings, the outer ring 11 is preferably positioned such that the opening 13 is offset from the nearest openings on the inner ring 12.

Figure 4:
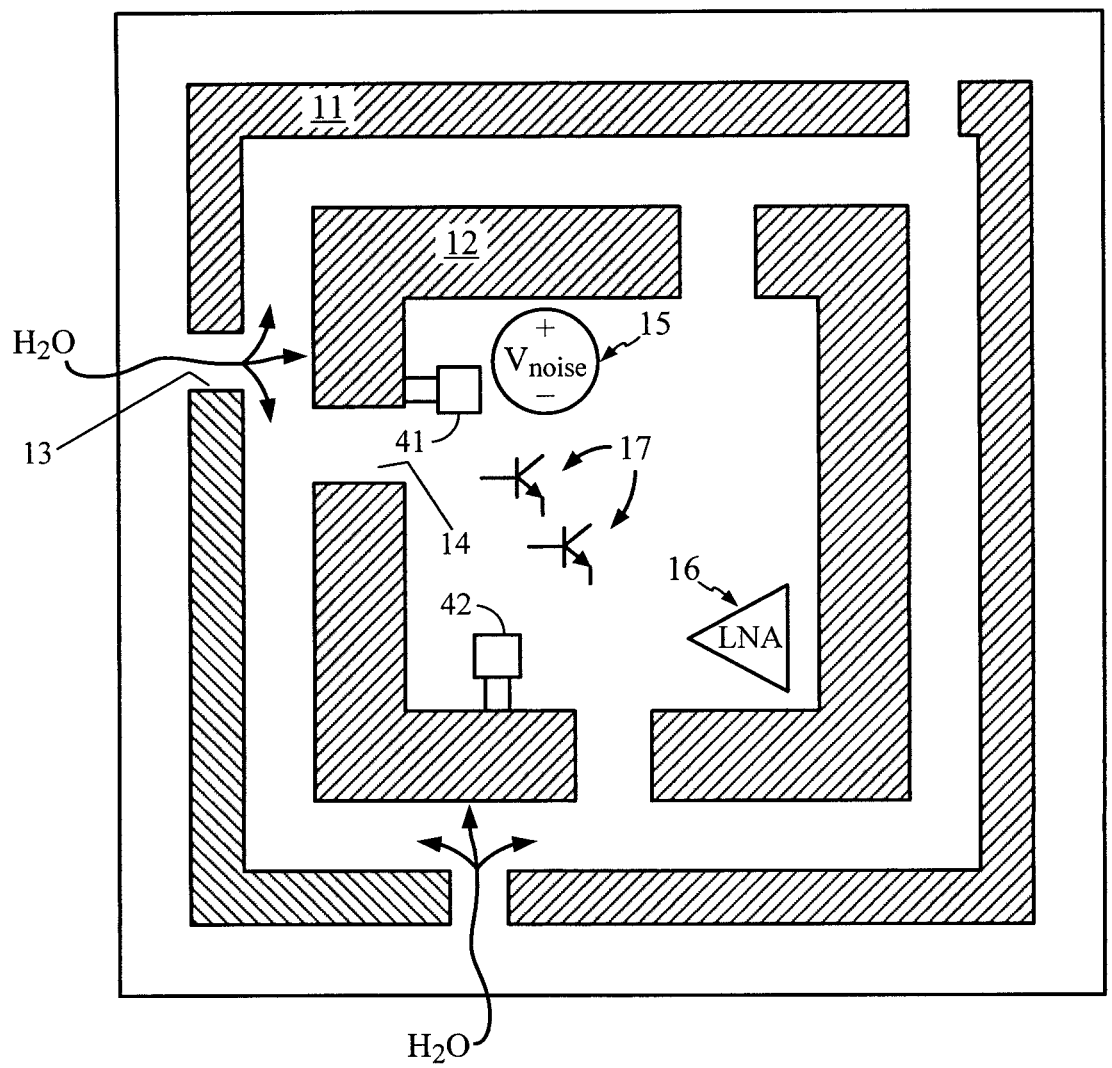
FIG. 4 is a schematic diagram of an alternate embodiment of a dual broken seal ring.

In one embodiment, openings 14 are provided in the inner seal ring in the vicinity of (or on each side of) a noise producing element 15 or noise sensitive component (e.g., an LNA 16). The seal ring segment is then provided with a dedicated ground (FIG. 4). Although not shown in the FIGURES, the LNA 16 could be provided in the lower left (as opposed to the lower right as depicted in FIG. 2). In this case, the L-shaped seal ring segment would have a dedicated ground.

In another embodiment, only a single opening is provided on the seal ring in the vicinity of the noise producing/sensitive component. In this case, the opening interrupts the shortest path between the noise producing element and the noise sensitive element.

Staggering the gaps increases the mean path moisture travels to penetrate into the IC and causes a large percentage of moisture to stay between the double seal rings. A single seal ring with a single cut, would allow a hair line crack to create a moisture path directly from the outside to the inside of the IC. Staggered cuts on a double seal ring make it difficult for a continuous hairline crack to develop from outside to inside.

In one embodiment, the substrate (e.g., silicon) beneath the openings 13, 14 can be heavily doped. To make the openings 13, 14 as resistive to noise as possible, the silicon doping is typically blocked. The resistivity to noise within each gap 13, 14 is therefore increased by changing the doping profile or blocking it altogether within the substrate under the gap 13, 14 so that signal propagation across the gaps 13, 14 is reduced.

In another embodiment, a dielectric is provided above the substrate inside the openings 13, 14. In yet another embodiment, a region which contains the electrical circuits is also filled with dielectric up to the height of the top metal of the inner seal ring 12. An outer region also can be provided with a dielectric. This outer region occurs when there is some space on the substrate between the outer metal ring 11 and the substrate edge.

FIG. 3B illustrates an alternate embodiment. As can be seen, it is possible to achieve moisture reduction and reduced noise propagation by fabricating a single wide seal ring 20 and then fabricating a channel 23 through the wide seal ring 20. The ingress and egress portions of this channel 23 are offset from each other. Preferably, the ingress and egress portions of the channel 23 are separated by at least 100 um to about 200 um. More generally speaking, the offset is smaller than the circuit block size. The configuration illustrated in FIG. 3B makes it difficult for moisture to penetrate into the IC, similar to the configuration shown in FIG. 3A.

Forming the channel 23 also reduces noise propagation because the wide seal ring 20 is broken into two parts, 21 and 22. The gap between the seal ring is much more resistant to noise current/signal than the metal of the seal ring 20. In one embodiment, the silicon beneath the channel is doped to the same resistivity as under the seal ring. For example, a p+ dopant can be added to the channel, which is the same dopant as under the seal ring. The channel can be approximately 200 um to 300 um to avoid moisture issues. The longer the channel 23, the more resistant to moisture; however less noise blocking results with longer dimensions. To make the opening as resistive as possible to noise signal transmission, silicon doping can be reduced or completely blocked.

FIG. 4 illustrates another embodiment that can be used with either the parallel seal ring embodiment illustrated in FIG. 3A or the wide seal ring embodiment illustrated in FIG. 3B. FIG. 4 shows two parallel seal rings 11, 12 with non-adjacent openings. However, the device of FIG. 4 also incorporates pads 41 and 42 connecting to each portion of the broken inner seal ring 12. The pads 41 and 42 can be connected to a ground either outside of the package, on the board or through a pin originating from the IC 401. The pads 41, 42 allows portions of the seal ring 12 to be grounded and therefore further reduce noise propagation. Alternatively, a pad may be added to only a single portion of the broken seal ring, or, in a two ring embodiment, a pad may be added to only one of the rings. It is beneficial to utilize as much grounding as possible. In one embodiment, ground pads are located very close to the seal ring. In another embodiment, a grounding pad is located on both sides of the broken seal ring segment.

For example, by forming a segment proximate to the LNA 16 with breaks on both sides of the LNA 16, a grounding pad could be added to the seal ring on both sides of this LNA 16. However, when grounding is very limited, one ground can be applied to only the critical segments.

Figure 5:
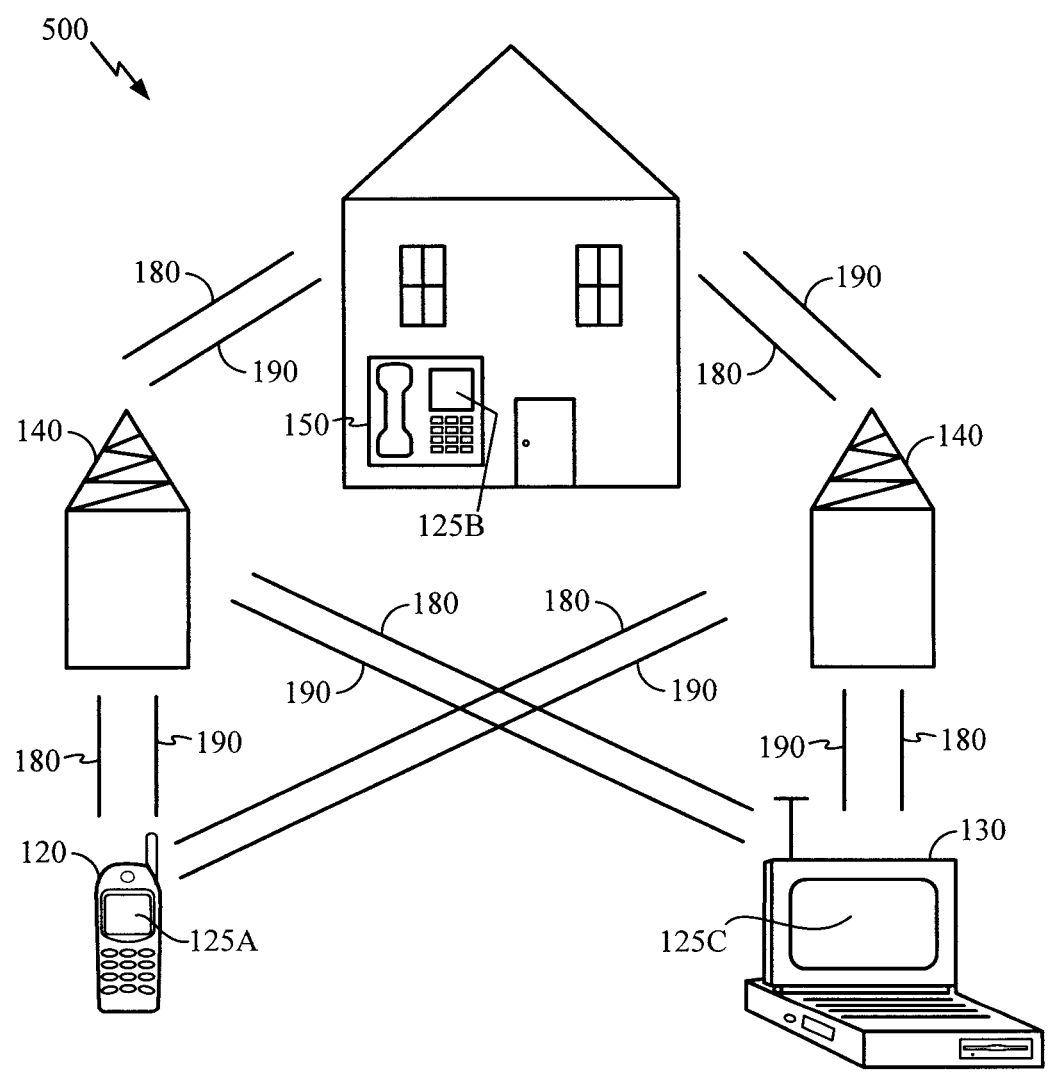
FIG. 5 is a schematic diagram showing a wireless communication system in which an embodiment of the disclosure may be advantageously employed.

FIG. 5 shows an exemplary wireless communication system 500 in which an embodiment of the disclosure may be advantageously employed. For purposes of illustration, FIG. 5 shows three remote units 120, 130, and 150 and two base stations 140. It will be recognized that typical wireless communication systems may have many more remote units and base stations. Remote units 120, 130, and 150 include ICs having dual broken seal rings 125A, 125B, and 125C, respectively, which are embodiments of the disclosure as discussed further below. FIG. 1 shows forward link signals 180 from the base stations 140 and the remote units 120, 130, and 150 and reverse link signals 190 from the remote units 120, 130, and 150 to base stations 140.

In FIG. 5, remote unit 120 is shown as a mobile telephone, remote unit 130 is shown as a portable computer, and remote unit 150 is shown as a fixed location remote unit in a wireless local loop system. For example, the remote units may be cell phones, hand-held personal communication systems (PCS) units, portable data units such as personal data assistants, or fixed location data units such as meter reading equipment. Although FIG. 5 illustrates remote units according to the teachings of the disclosure, the disclosure is not limited to these exemplary illustrated units. The disclosure may be suitably employed in any device which includes ICs having dual broken seal rings.

Thus, it can be seen, the disclosed seal ring configurations reduce substrate coupling of noise, thereby improving isolation of IC devices from substrate noise. Circuit performance is improved, for example improving low noise amplifier sensitivity and noise figure, enables better radio receiver system sensitivity.

Although the present disclosure and its advantages have been described in detail, it should be understood that various changes, substitutions and alterations can be made herein without departing from the spirit and scope of the disclosure as defined by the appended claims. For example, although two seal rings have been described, more than two seal rings are contemplated. Similarly, although the preceding description was with respect to a die including analog components, an all digital die for example a microprocessor, could include the disclosed seal rings to isolate digital signals. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A sealing system for an integrated circuit, comprising:
    a first seal ring circumscribing the integrated circuit, the first seal ring including at least one gap;
    a second seal ring circumscribing the first seal ring, the second seal ring including at least one gap offset from the at least one gap of the first seal ring; and
    a doped area under each gap having a dopant concentration that is lower than a dopant concentration directly beneath any portion of the first and second seal rings, said doped areas, increasing resistivity to signal propagation across each gap.

2. The sealing system of claim 1 further comprising at least one grounded pad connected to the first seal ring.

3. The sealing system of claim 1 wherein the first seal ring comprises at least two gaps and the second seal ring comprises at least two gaps.

4. The sealing system of claim 1 further comprising at least one grounded pad connected to the second seal ring.

5. A sealing system for an integrated circuit (IC), comprising:
    a first seal means circumscribing the integrated circuit, the first seal means including at least one gap;
    a first doped channel having a first dopant concentration underlying and following a path of the first seal means; and
    a second seal means circumscribing the first seal means, the second seal means including at least one gap offset from the at least one gap of the first seal means;
    a second doped channel having a second dopant concentration underlying and following a path of the second seal means,
    wherein at least one gap portion of the first doped channel underlies the at least one gap of the first seal means and has a dopant concentration less than the first dopant concentration.

6. The sealing system of claim 5 further comprising a grounding means connected to the first seal means.

7. The sealing system of claim 5 wherein the first seal means comprises at least two gaps and the second seal means comprises at least two gaps.

8. The sealing system of claim 5 further comprising a grounding means connected to the second seal means.

9. The sealing system of claim 8, where the grounding means is grounded via a pin on the IC.

10. The sealing system of claim 5 wherein a gap portion of the second doped channel underlying the at least one gap of the second seal means has a dopant concentration less than the second dopant concentration.

11. The sealing system of claim 5 wherein the at least one gap portion of the first doped channel is substantially undoped.

12. An integrated circuit with a sealing system, comprising:
    a substrate including a first doped channel having a first dopant concentration, the first doped channel including a gap portion having a dopant concentration less than the first dopant concentration;
    a first seal ring circumscribing the integrated circuit overlying and following a path of the first doped channel, the first seal ring including at least one gap overlying the gap portion of the first doped channel; and
    a second seal ring circumscribing the first seal ring.

13. The integrated circuit of claim 12, wherein the at least one gap portion of the first doped channel is substantially undoped.

14. A method for forming a sealing system for an integrated circuit, comprising:
    providing a substrate;
    forming a first doped channel in the substrate having a first dopant concentration, the first doped channel including at least one gap portion having a dopant concentration less than the first dopant concentration;

forming a second doped channel in the substrate having a second dopant concentration, the second doped channel including at least one gap portion having a dopant concentration less than the second dopant concentration;

forming a first seal ring circumscribing the integrated circuit overlying and following the first doped channel, the first seal ring including at least one gap overlying the at least one gap portion of the first doped channel; and forming a second seal ring circumscribing the first seal ring overlying and following the second doped channel, the second seal ring including at least one gap offset from the at least one gap of the first seal ring and overlying the at least one gap portion of the second doped channel.

15. The method of claim 14 including blocking a doping of the at least one gap portion of the first doped channel when forming the first doped channel and blocking a doping of the at least one gap portion of the second doped channel when forming the second doped channel.

16. A sealing system for an integrated circuit, comprising:
a substrate;
a first doped channel following a first path along the substrate, the first doped channel having a first dopant concentration and having at least one gap, a dopant concentration of the at least one gap being different than the first dopant concentration;
a first seal ring circumscribing the integrated circuit and overlying and following the first doped channel, the first seal ring including at least one gap overlying the at least one gap in the first doped channel;
a second doped channel following a second path along the substrate, circumscribing the first doped path, the second doped channel having a second dopant concentration and having at least one gap, a dopant concentration of the at least one gap of the second doped channel being different than the second dopant concentration;
a second seal ring circumscribing the first seal ring and overlying and following the second doped channel, the second seal ring including at least one gap offset from the at least one gap of the first seal ring and overlying the at least one gap in the second doped channel.

17. The sealing system of claim 16, wherein the dopant concentration of the at least one gap in the first doped channel is substantially zero.

18. The sealing system of claim 16, including at least one grounded pad connected to the second seal ring.

19. The sealing system of claim 16, wherein the dopant concentration of the at least one gap of the first doped channel is less than the first dopant concentration.

20. A method for forming a sealing system for an integrated circuit, comprising:
steps for providing a substrate;
steps for forming a first doped channel in the substrate having a first dopant concentration, the first doped channel including at least one gap portion having a dopant concentration less than the first dopant concentration;
steps for forming a second doped channel in the substrate having a second dopant concentration, the second doped channel including at least one gap portion having a dopant concentration less than the second dopant concentration;
steps for forming a first seal ring circumscribing the integrated circuit overlying and following the first doped channel, the first seal ring including at least one gap overlying the at least one gap portion of the first doped channel; and
steps for forming a second seal ring circumscribing the first seal ring overlying and following the second doped channel, the second seal ring including at least one gap offset from the at least one gap of the first seal ring and overlying the at least one gap portion of the second doped channel.

* * * * *